United States Patent
Shanel et al.

(10) Patent No.: US 11,430,633 B2
(45) Date of Patent: Aug. 30, 2022

(54) ILLUMINATION APERTURES FOR EXTENDED SAMPLE LIFETIMES IN HELICAL TOMOGRAPHY

(71) Applicant: FEI Company, Hillsboro, OR (US)

(72) Inventors: Ondrej L. Shanel, Brno (CZ); Trond Karsten Varslot, Vuku (NO); Martin Schneider, Brno (CZ); Maarten Kuijper, Helmond (NL); Ondrej R. Baco, Pristpo (CZ); Václav Batelka, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 17/137,130

(22) Filed: Dec. 29, 2020

(65) Prior Publication Data
US 2022/0208511 A1    Jun. 30, 2022

(51) Int. Cl.
*H01J 37/28* (2006.01)
*H01J 37/09* (2006.01)
*H01J 37/20* (2006.01)

(52) U.S. Cl.
CPC .............. *H01J 37/28* (2013.01); *H01J 37/09* (2013.01); *H01J 37/20* (2013.01); *H01J 2237/0451* (2013.01)

(58) Field of Classification Search
CPC .......... H01J 37/00; H01J 37/02; H01J 37/023; H01J 37/26; H01J 37/261; H01J 37/28; H01J 37/09; H01J 37/20; H01J 2237/0451; H01J 2237/2802
USPC ................................ 250/306, 307, 311, 396 R
See application file for complete search history.

(56) References Cited

U.S. PATENT DOCUMENTS

| | | | |
|---|---|---|---|
| 10,522,262 B2 | 12/2019 | Song et al. | |
| 2003/0089851 A1* | 5/2003 | Katagami | H01J 37/256 250/311 |
| 2012/0235035 A1* | 9/2012 | Nagaoki | H01J 37/26 250/311 |
| 2017/0301507 A1* | 10/2017 | Shimizu | H01J 37/20 |
| 2020/0170601 A1 | 6/2020 | Gagnon et al. | |

FOREIGN PATENT DOCUMENTS

WO    2013127005 A1    9/2013

OTHER PUBLICATIONS

Migunov et al., "Rapid low dose electron tomography using a direct electron detection camera," Scientific Reports, 5, 14516, (Nov. 2015), 5 pages.
Extended European Search Report from European Application No. 21214237.6, dated May 10, 2022, 11 pages.

\* cited by examiner

*Primary Examiner* — Jason L McCormack
(74) *Attorney, Agent, or Firm* — Klarquist Sparkman, LLP

(57) ABSTRACT

Apertures having references edges are situated to define a sample irradiation zone and a shielded zone. The sample irradiation zone includes a portion proximate the shielded zone that is conjugate to a detector. A sample is scanned into the sample irradiation zone from the shielded zone so that the sample can remain unexposed until situated properly with respect to the detector for imaging. Irradiation exposure of the sample is reduced, permitting superior imaging.

19 Claims, 8 Drawing Sheets

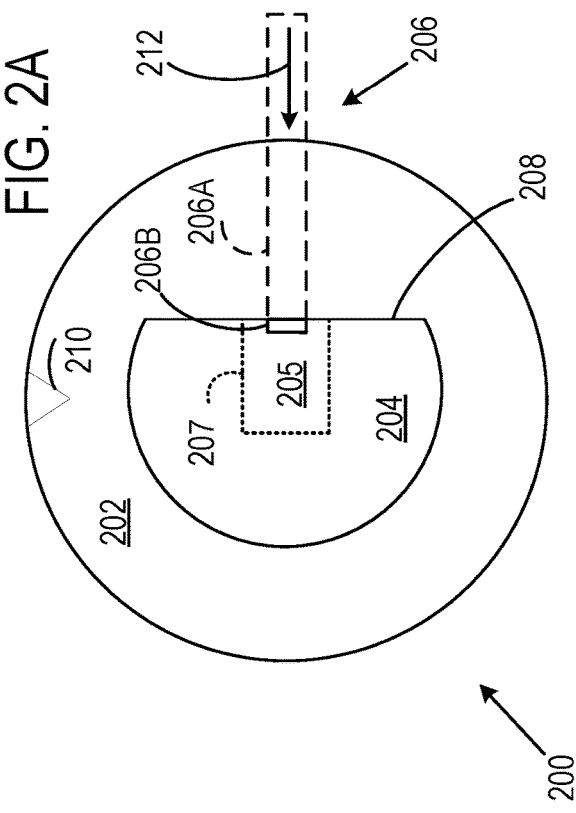
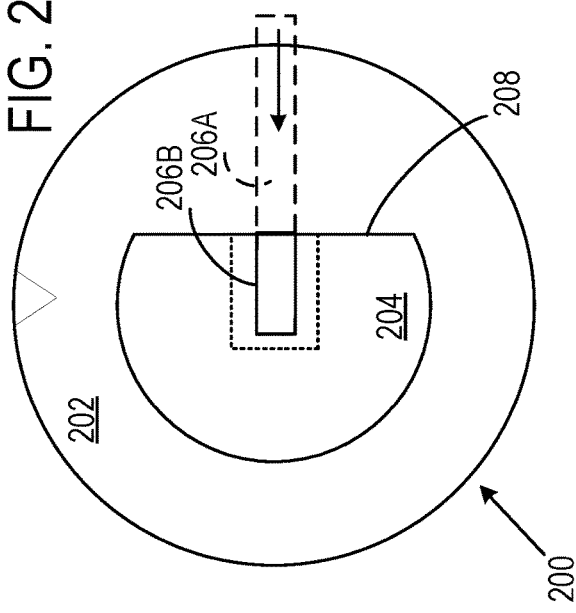
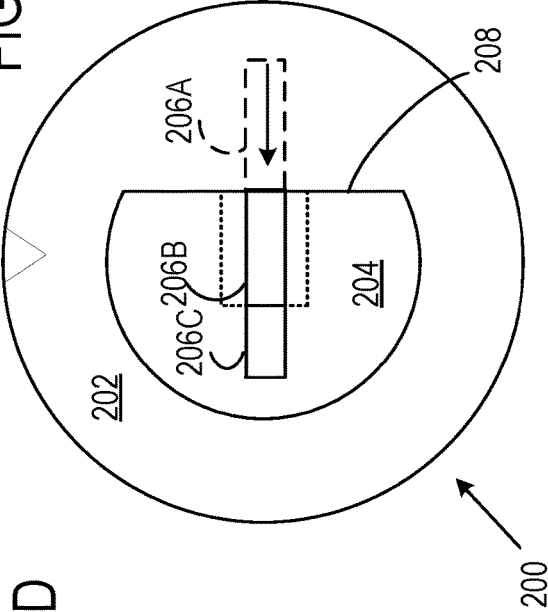
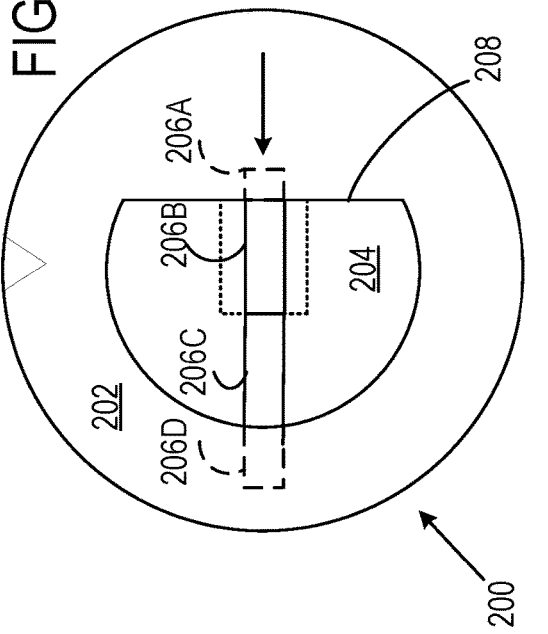

ILLUMINATION APERTURES FOR EXTENDED SAMPLE LIFETIMES IN HELICAL TOMOGRAPHY

FIELD

The disclosure pertains to imaging with electron beams, particularly helical tomography.

BACKGROUND

Transmission electron microscopes (TEMs) can be used to obtain high resolution images that reveal important details of many kinds of samples, including biological samples. In typical applications, a sample of interest is placed on an electron transmissive lamella for support and the lamella and sample are exposed to an electron beam. Many samples of interest can be damaged or otherwise altered by exposure to the electron beam and the dose (total charge) that can be applied without damage is limited. In some cases, multiple images of a sample are needed such as in electron beam tomography. Even if low doses are used for each image, acquisition of multiple images can produce sample damage so that the final acquired images do not correspond to the initial sample structure. Moreover, low dose exposures can result in noisy images. Improved approaches that permit satisfactory imaging without producing unacceptable sample damage are needed.

SUMMARY

Methods comprise defining an irradiation zone with a beam limiting aperture and situating a detector to receive radiation from a detector zone of the irradiation zone, wherein the detector zone is conjugate to a detector active area. A first portion of a sample is positioned within the detector zone, wherein at least a second portion of the sample is positioned outside of the irradiation zone. A first image of the first portion of the sample if produced based on radiation received by the detector when the first portion of the sample is positioned within the detector zone. The sample is translated so that the second portion of the sample is positioned within the detector zone and a second image of the second portion of the sample is produced based on radiation received by the detector when the second portion of the sample is positioned within the detector zone. In examples, the sample is translated so that a third portion of the sample positioned outside of the irradiation zone is moved into the detector zone and a third image of the third portion of the sample is produced based on radiation received by the detector when the third portion of the sample is positioned within the detector zone.

In a representative example, a plurality of translations of the sample are applied to position each of a plurality of additional portions of the sample situated outside of the irradiation zone within the detector zone, Images of each of the additional portions are produced based on radiation received by the detector when each additional portion of the sample is positioned within the detector zone. In some examples, the radiation is produced by a charged particle beam. In typical examples, the detector has at least one edge and the beam limiting aperture defines a conjugate edge in the detector zone, and the first and second portions of the sample are translated into the detector zone at the conjugate edge. The beam limiting aperture can include an arc-shaped perimeter portion defining a portion of the irradiation zone that that extends beyond the detector zone. At least a portion of the sample can be scanned from the detector zone into the portion of the irradiation zone that that extends beyond the detector zone. The shielded area can be conjugate to a portion of the detector active area. A plurality of images of at least the first and second portions of the sample can be produced at a plurality of rotation angles. The first and second portions of the sample can be stepped into the detector zone or continuously scanned into the detection zone.

Charged particle beam systems comprise a charged particle beam source operable to produce a charged particle beam and an aperture plate defining a beam limiting aperture having a linear edge. The aperture plate is situated to receive the charged particle beam and produce a sample irradiation zone corresponding to the beam limiting aperture. A detector is situated to receive radiation from a detector zone of the irradiation zone. The detector zone is conjugate to a detector active area and has a detector zone edge conjugate to the linear edge of the beam limiting aperture. The detector is situated to produce images of sample portions introduced into the detector zone at the detector zone edge. In examples, the charged particle beam is an electron beam and the detector is operable to produce the images based on portions of the electron beam scattered, reflected, or transmitted by the sample. The beam limiting aperture can have an arcuate edge that terminates at the linear edge. The sample irradiation zone can include an area extending beyond the detector zone. The detector can b operable to produce the images as a first part of the sample is introduced into detector zone and a second part of the sample exits the detector zone. The detector can be situated so that the detector zone edge is situated to be conjugate to an edge of a detector active area. The linear edge is situated to define a shielded area so that the sample is introduced from the shielded area into the detector zone. A sample stage is operable to translate the sample into the detector zone and rotate the sample about at least one axis, wherein the detector is operable to produce images at a plurality or rotations.

Methods comprise defining a shielded zone and a sample irradiation zone with a reference edge of a beam limiting aperture and situating a detector so that at least a portion of the sample irradiation zone is conjugate to the detector. Images of the sample are acquired with the detector by introducing the sample into the sample irradiation zone from the shielded zone at the reference edge.

The foregoing and other features and advantages of the disclosed technology will become more apparent from the following detailed description, which proceeds with reference to the accompanying figures.

BRIEF DESCRIPTION OF THE DRAWINGS

FIGS. 2A-2D illustrate sample exposures using a beam limiting aperture (BLA).

DETAILED DESCRIPTION

Introduction

Figure 1:
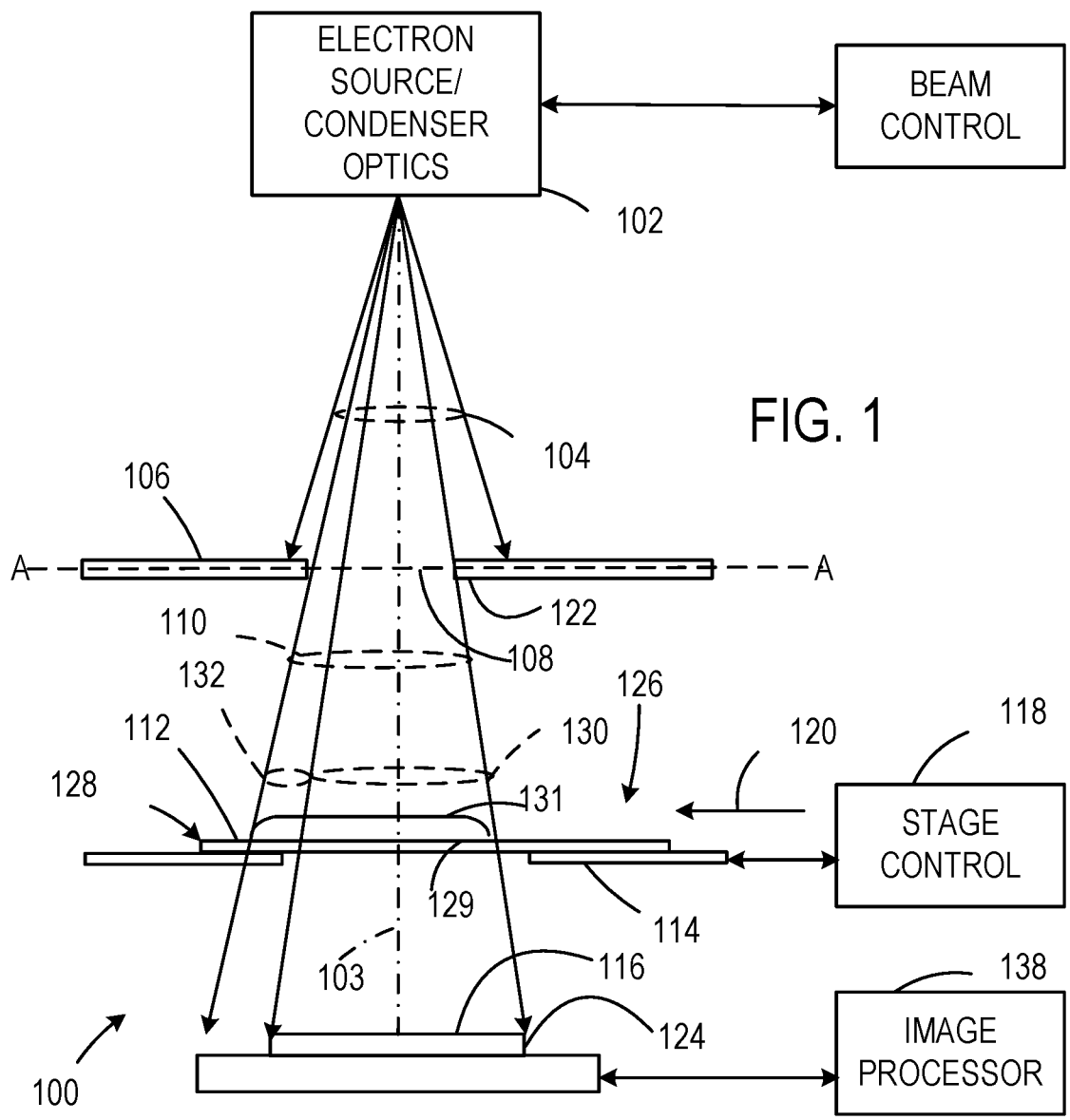
FIG. 1 illustrates a representative TEM system that includes a beam limiting aperture having a protective edge based on an electron detector geometry.

Methods and apparatus are described below that can permit reduced radiation exposure to samples so that multiple images can be obtained with reduced damage or sample alteration. These approaches are particularly useful for electron beam imaging of biological samples that do not tolerate e-beam exposures. In some applications such samples are pillar-shaped and require multiple image exposures to produce satisfactory images. By protecting portions of samples that are not being imaged from radiation exposure, longer exposures can be used to obtain more and superior images. The examples below are based on image acquisition in TEMs for electron beam tomography for convenient illustration. Tomographic imaging can require multiple images with specimens at many different tilt angles so that reducing dose is particularly useful in this application. The disclosed methods and apparatus can be used in other charged-particle-beam (CPB) imaging systems or imaging systems using ion beams or electromagnetic radiation such as X-rays, ultraviolet, visible, infrared, or other optical radiation provided by lasers, LEDs, or other sources. Imaging can be based on reflected or scattered radiation (including secondary emission in CPB systems), but transmission-based imaging is used for clarity in the description. The examples are typically disclosed with reference to a beam limiting aperture (BLA) that is situated in an optical system such as a TEM electron beam system and defines an extent of a beam that is incident to a sample and accordingly a portion of a detector that receives beam portions from the sample. Radiation refers to electromagnetic radiation such as noted above as well as neutral and charged particle beams.

As used herein, image refers to a visual image presented for viewing by a technician or other person with a display device or stored data that is associated with such visual images such data stored in JPG, TIFF, BMP, RAW, or other formats. Images are typically rectangular but other shapes can be used, and images can have curved or other borders and various shapes.

Detectors used in the disclosed approaches are generally selected based on the type of radiation to be detected. In many cases, detector arrays are available that comprise rectangular arrays of radiation-sensitive elements. Detectors generally include a radiation-sensitive area such as that defined by arrays of radiation-sensitive elements and can include circuitry for operation of detector elements such as bias or amplifier circuitry and the associated portions are not generally sensitive to incident radiation. Unless otherwise noted, detector active area as used herein refers to a portion of a detector that is responsive to incident radiation. Although integrated detector arrays are convenient, single element or other detector array configurations can be used.

In the examples, apertures are defined in substrates such as metal substrates such as gold, platinum, tungsten or other metals, semiconductors such as silicon, or insulators such as ceramics. Semiconductor or insulator substrates when used with CPB systems must generally be provided with a conductive layer to eliminate or reduce charging.

Aperture substrate material and thickness are selected to substantially attenuate incident radiation. As used herein, aperture substrates reduce radiation intensity by factors of at least 0.75, 0.5, 0.25, 0.1, 0.05, 0.01, 0.005, 0.001, or more. Large attenuations provide superior sample shielding.

In the examples, images are generally projection images obtained by directing a beam of radiation to a sample and measuring transmission through the sample without additional imaging forming elements such as lenses. As used herein, "sample scanning" refers to a continuous, step-wise or other iterative movement (typically, translations) of a sample into an irradiation zone to expose previously shielded regions of the sample for imaging. Although it is generally convenient to scan samples, an irradiation zone can be similarly scanned, wherein "irradiation zone scanning" refers to a continuous, step-wise or other iterative movement (typically, a translation) of an irradiation zone with respect to a sample to expose previously shielded regions of the sample for imaging. Images are typically acquired continuously, periodically, or at other times during scanning. A sample can also be tilted or rotated during scanning for tomographic imaging.

As used herein, planes or other locations that are imaged onto each other are referred to as conjugate to each other or more simply as conjugate. In some examples, features of one or more objects such as apertures or edges are imaged corresponding conjugate locations and these features are referred to as conjugate. Conjugate locations can be established by imaging with one or more optical elements situated between the locations. Locations at which silhouettes of objects are produced are also referred to as conjugate. For example, apertures irradiated by a collimated or diverging radiation beam can be situated to produce silhouettes of the apertures at a plurality of conjugate locations.

Samples of various shapes can be imaged as disclosed herein. For example, samples can be lamella, but other shapes such as columns, pillars, or needles can be imaged.

Example 1

Referring to FIG. 1, a representative transmission electron microscope system 100 includes an electron beam source and associated condenser optics 102 that direct an electron beam 104 along an axis 103 to an aperture substrate 106 that defines a beam limiting aperture 108. The electron beam 104 is shown as a diverging beam for convenient illustration but can be diverging, converging, or collimated during propagation. At the aperture substrate 106, the beam limiting aperture 108 defines a transmitted electron beam 110 that propagates to a sample 112 that is situated on a stage 114 that can scan and tilt the sample with respect to the transmitted electron beam 110. The transmitted electron beam 110 thus defines an irradiation zone at the sample 112, i.e., an area that is situated to receive radiation as limited by the beam limiting aperture 108. The transmitted electron beam 110 then propagates towards a detector 116 after interaction with the sample 112. In typical implementations, a stage controller 118 is operable to scan the sample 112 in a direction 120 through the transmitted electron beam 110. For tomographic imaging, the stage controller 118 can also provide a range of tilts but these are not shown in FIG. 1.

In one example, the stage controller 118 causes the stage 114 to translate the sample 112 step-wise or continuously in the direction 120 and acquire a series of sample images at a range of tilt angles at each step. The aperture 108 is situated so that a first aperture edge 122 (referred to as a "leading edge") corresponds to a detector edge 124. The aperture edge 122 can be referred to as "projected" to the detector edge 124, or the aperture edge 122 and the detector edge 124 can be referred to as conjugate or optically conjugate. In this arrangement, a sample portion 126 that is to be scanned into the transmitted beam portion 110 is not exposed until positioned with respect to the detector 124 for imaging while a portion 129 is exposed. Any exposure prior to the imaging exposure does not contribute to imaging but can cause sample damage. The detector 116 is coupled to an image processor 138 that can store, combine, process, communicated, or otherwise control acquired images.

In this example, the transmitted electron beam 110 includes an imaging portion 130 that corresponds to the detector 116 and a post-imaging portion 132 that is incident to a sample portion 128 that has previously been scanned for imaging. These beam portions irradiation the sample in an irradiation zone 131. While the additional exposure by the post-imaging portion 132 may alter samples, imaging of the sample portion 128 has already been completed, this sample damage does not degrade sample images.

Figure 1A:
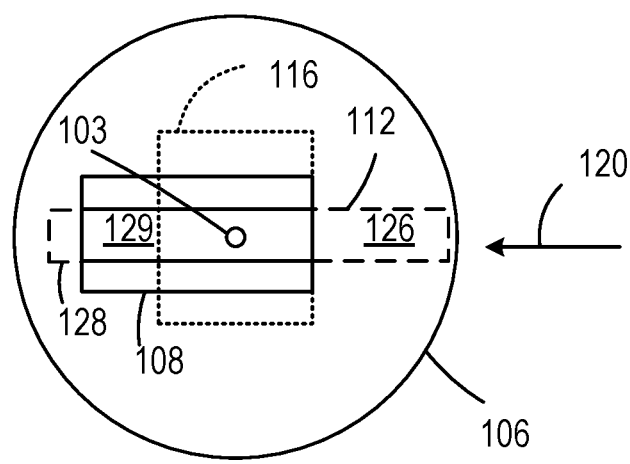
FIG. 1A illustrates a beam limiting aperture such as shown in FIG. 1.

The first aperture edge 122 is preferably situated to correspond to the edge 124 of the detector 116. Typical array detectors have linear boundaries so that the first aperture edge can be a straight line. FIG. 1A is a schematic view of the aperture substrate 106 down the axis 103 showing relative positions of the sample 112, the aperture 108, and the detector 116. Through the aperture 108, the exposed portion 129 of the sample is visible, while the portion 126 to be exposed and the previously exposed portion 129 are obscured. The location of the detector 116 is indicated showing that only some of the exposed portion 129 of the sample is being imaged, the remaining portion having be imaged earlier.

Example 2

FIGS. 2A-2D illustrate irradiation of a sample 206 that is scanned through an irradiation zone 204 defined by an aperture in an aperture substrate 200. The irradiation zone 204 includes a detector zone 205 that corresponds to a detector active area 207 imaged into the irradiation zone by one or more optical elements or by proximity focusing or otherwise situated and configured so that samples situated at the detector zone 205 are image by a detector. As used herein the detector zone 205 of the irradiation zone 204 is referred to as being conjugate to the detector active area and as a conjugate area or a detector conjugate area. In this example the detector zone 205 corresponds to substantially the entire detector area and an aperture edge 208 corresponds to a detector active area edge. In other examples, portions of a detector zone are shielded by the aperture substrate 200 and do not extend into the irradiation zone 204. For convenient description, the irradiation zone 204 can be referred to as corresponding to or conjugate to a detector plane, wherein the detector plane includes a portion corresponding to the detector active area. In this example, the aperture substrate 200 includes a notch 210 or other feature that can be used to align the aperture edge 208 with respect to a detector edge.

In FIG. 2A, the sample 206 (scanned in a direction 212) has a portion 206B that extends into the detector zone 205 of the irradiation zone 204 and a portion 206A that is shielded by the aperture substrate 200. In FIG. 2B, the sample 206 is further scanned into the irradiation zone 204 to introduce previously shielded portions so that the portion 206B in the detector area 204 is larger and the portion 206A that is shielded is smaller. In FIG. 2C, the sample 206 is scanned further into the irradiation zone 204 so the portion 206B extends fully across the detector zone 205 and a portion 206C extends beyond the detector zone 205 and is scanned from the detector zone into a portion of the irradiation zone that extends beyond the area conjugate to the detector. The portion 206C can be imaged as it passes through the detector zone 205 and radiation induced damage or changes produced during additional exposure do not degrade sample images. In FIG. 2D, the sample 206 is scanned so that a portion 206D is shielded by the aperture substrate while imaging of the portion 206B in detector zone 205 can continue. The sample 206 can be scanned to pass completely through the detector zone 205, but such scanning is not shown.

Example 3

FIGS. 3A-3E illustrate representative apertures that can provide reduced dose during imaging. For convenient illustration, a location of a sample 302 is shown, and includes portions situated as having been previously exposed 304, currently exposed 305, and to be exposed 306 with respect to a detector zone 307 that is conjugate to a detector active area and having an edge 308. In these examples, an exposure zone 309 is larger than a conjugate detector area, but in other examples the exposure zone can be selected to match the detector area.

Figure 3A:
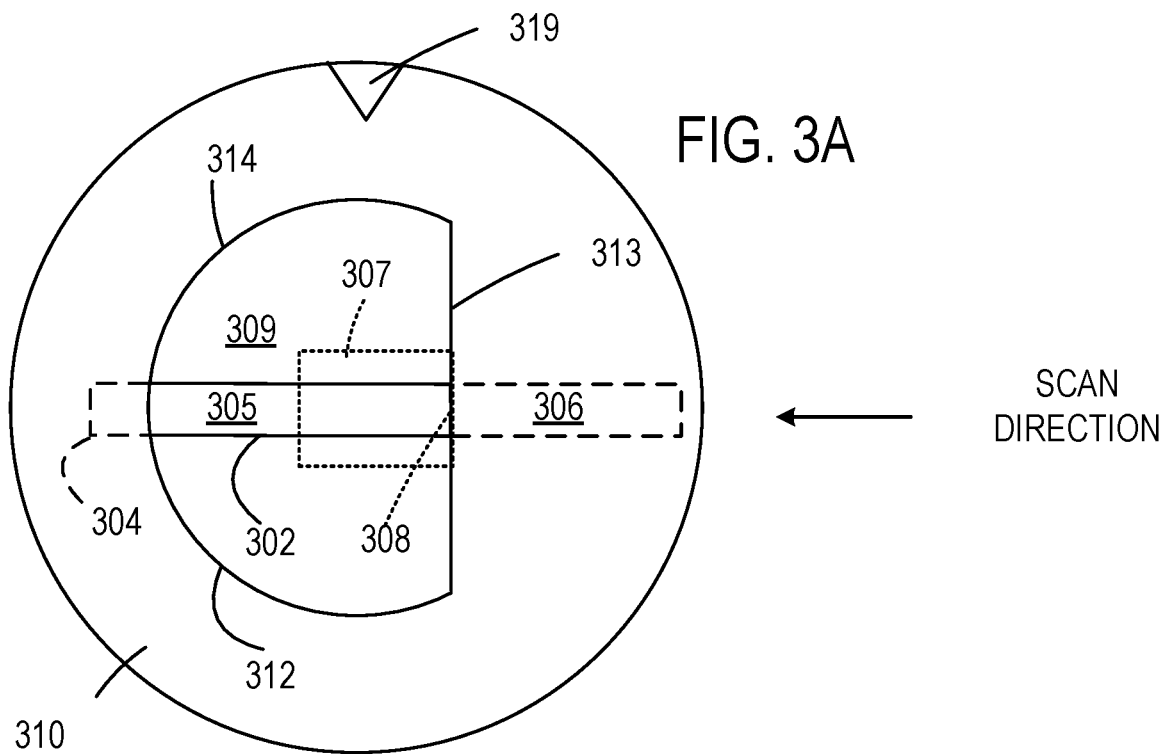
FIGS. 3A-3F illustrate representative beam limiting apertures.
Figure 3B:
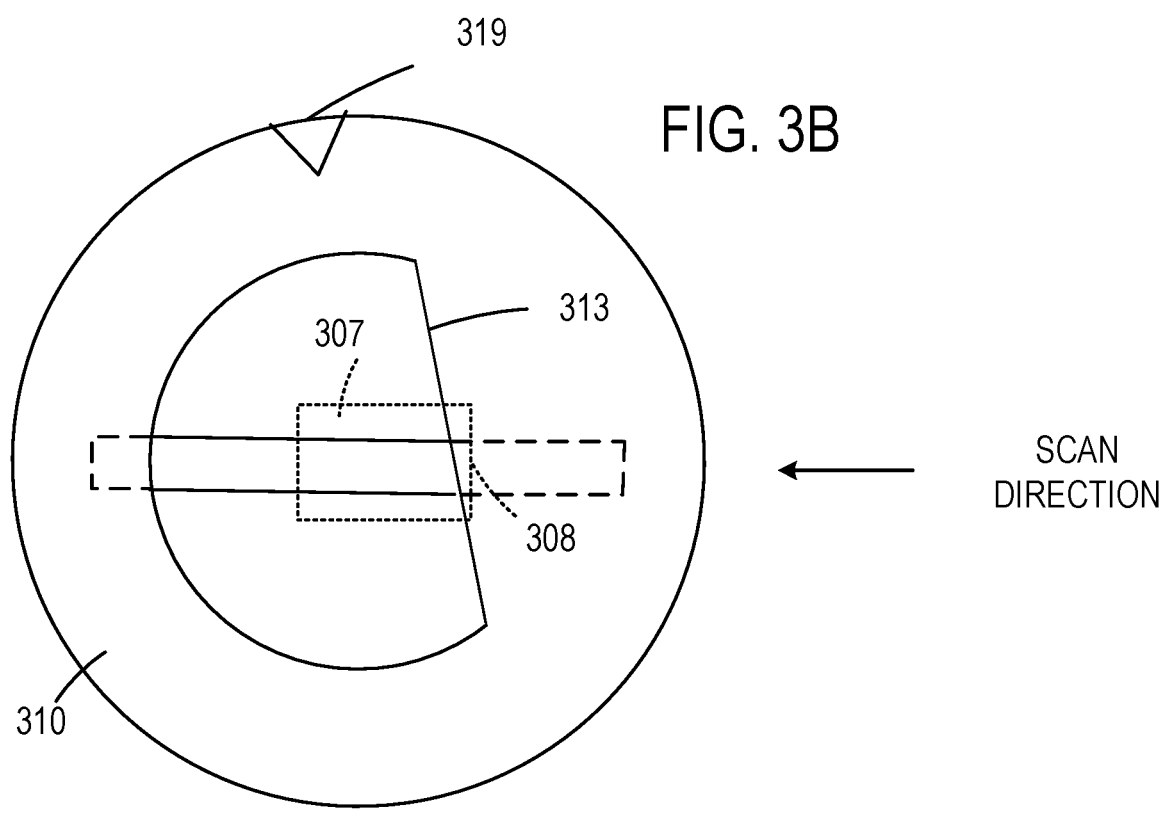

Referring to FIG. 3A, an aperture plate 310 defines an aperture 312 having a straight edge 313 (used as a leading edge in sample exposures) and an arc-shaped edge 314 that is, in this example, a portion of a circular arc A notch 319 or other fiducial marking or feature can be provided to permit aligning the straight edge 313 with the detector edge 308. FIG. 3B illustrates the aperture plate 310 mis-aligned so that the edge 313 is tilted with respect to the detector zone 307. This arrangement nevertheless can permit dose reduction.

Figure 3C:
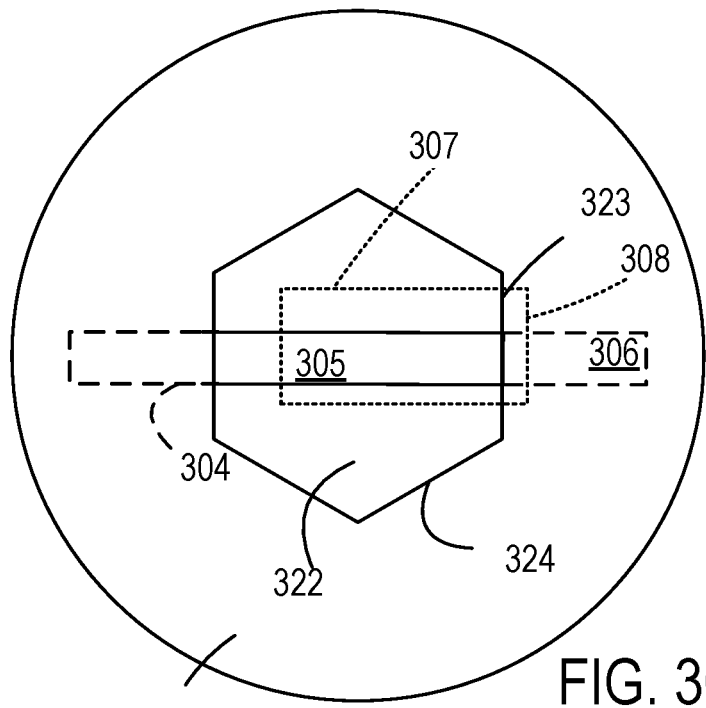
Figure 3D:
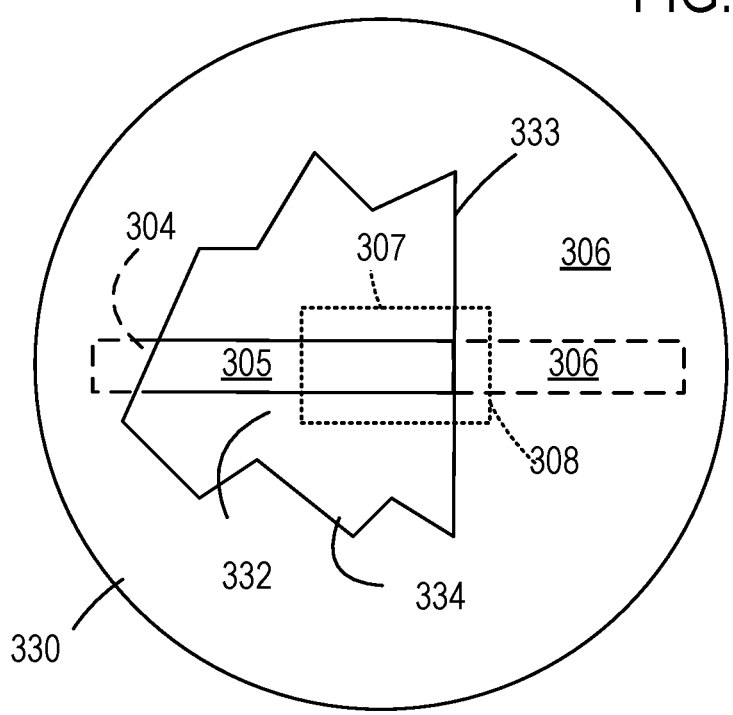
Figure 3E:
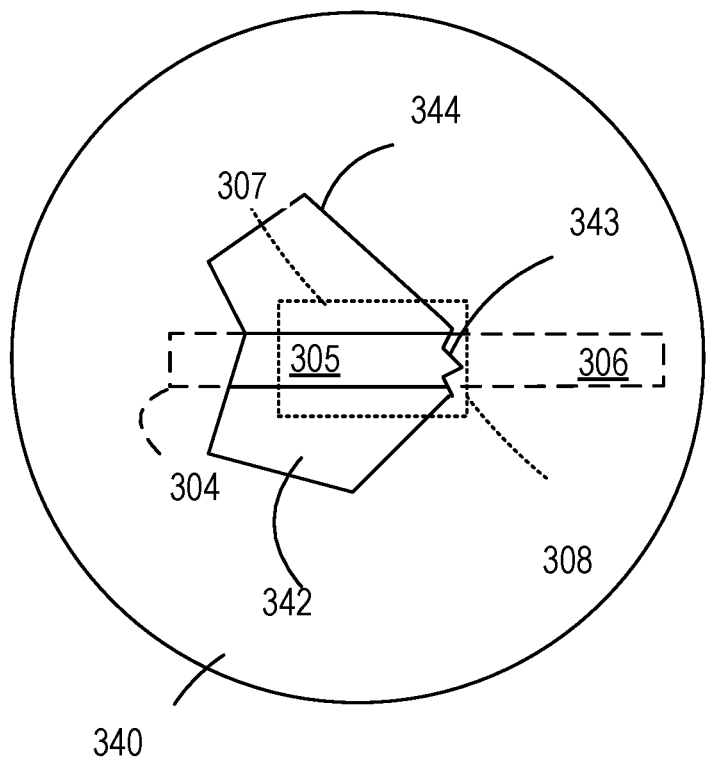

Referring to FIG. 3C, an aperture plate 320 defines a polygonal (hexagonal) aperture 322 having a straight (leading) edge 323 (used as a leading edge in sample exposures) and a polygonal edge 324. In this example, the edge 308 of the detector zone 307 is parallel to but displaced from the leading edge 323. Referring to FIG. 3D, an aperture plate 330 defines an irregular aperture 332 having a straight edge 333 (used as a leading edge in sample exposures) and an irregular edge 334. In this example, the edge 308 of the detector zone 307 is not exactly aligned with the leading edge 333. Referring to FIG. 3E, an aperture plate 340 defines an irregular aperture 342 having a jagged (leading) edge 343 (used as a leading edge in sample exposures) and an irregular edge 344. In this example, the edge 308 of the detector zone 307 is not aligned with the leading edge 343.

Figure 3F:
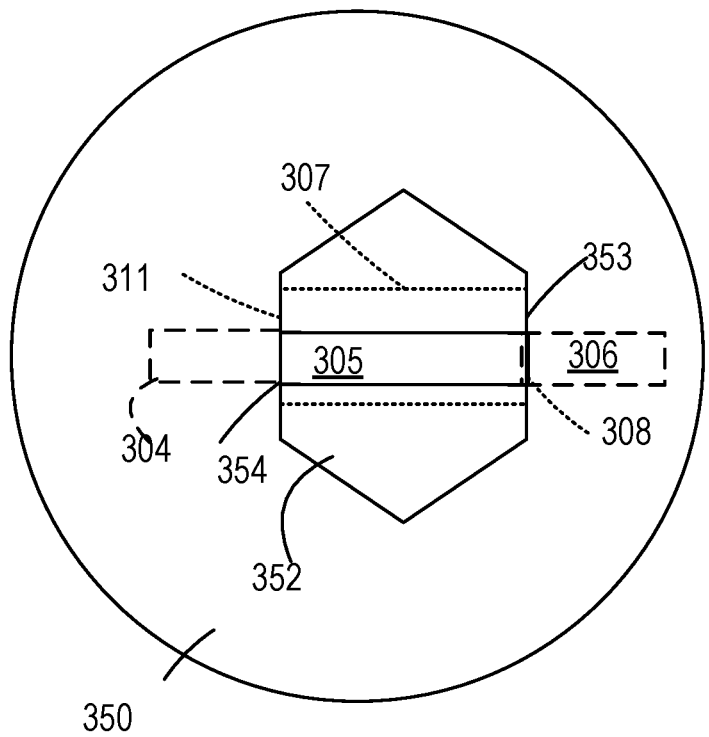

Referring to FIG. 3F, an aperture plate 350 defines a polygonal aperture 352 having a linear leading edge 353 and linear trailing edge 354. In this example, the edges 353, 354 correspond to the edges 308, 311 of the detector zone 307.

Example 4

Figure 4:
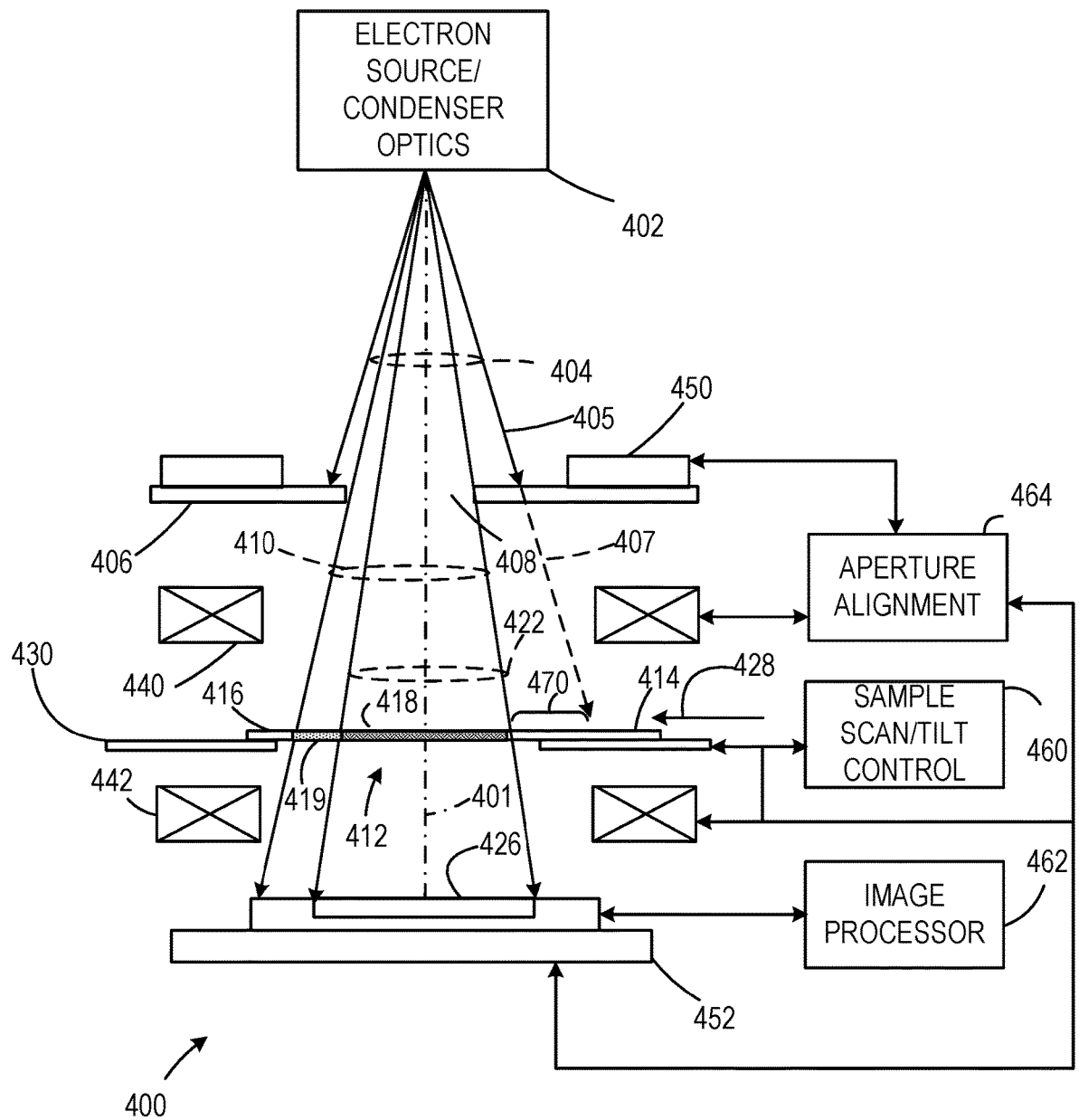
FIG. 4 illustrates a TEM system configured for alignment of a beam liming aperture that is situated and configured based on an electron detector geometry.

Referring to FIG. 4, a representative electron optical system 400 includes an electron source/condenser optical system 402 that directs an electron beam 404 along an axis 401 to an aperture plate 406. The aperture plate 406 defines a beam limiting aperture 408 that limits the electron beam 404 to produce an apertured electron beam 410. The apertured electron beam 410 propagates to a sample 412. Sample portions 414, 416 are not exposed due to limiting by the aperture 408 which defines a shielded zone 470 Samples are exposed in an irradiation zone defined by the apertured beam 410. As used herein, an irradiation zone is a zone in the plane of the sample that is irradiated. Propagation of a peripheral beam portion 405 is indicated along with propagation of this beam portion in the absence of the aperture plate as indicated at 407. Only sample portions 418, 419 are exposed, but only the exposed portion 418 is imaged by a detector 426, corresponding to an imaging portion 422 of the apertured electron beam 410. The sample 412 can be scanned or stepped, for example, in a direction 428 with a stage 430 so that exposure of sample portions to the electron beam begins when situated suitably with respect to the detector 426 for imaging.

Beam deflectors, electron lenses, or other beam manipulation elements such as illustrated at 440, 442 can be used for beam shaping and to align the apertured electron beam 410 with respect to the detector 426. For example, an alignment control 464 can be used to control the elements 440, 442 to align the apertured electron beam 410. Additionally or alternatively, the alignment control can be coupled to a stage 450 that moves the aperture plate 406, a sample stage 430 that is coupled to move the sample 412, or a detector stage 452 that can position the detector 426. A controller 460 is coupled to the sample stage 430 to scan and tilt the sample 412 for imaging and an image processor 462 is coupled to the detector 426 to receive and process sample images.

Example 5

Figure 5:
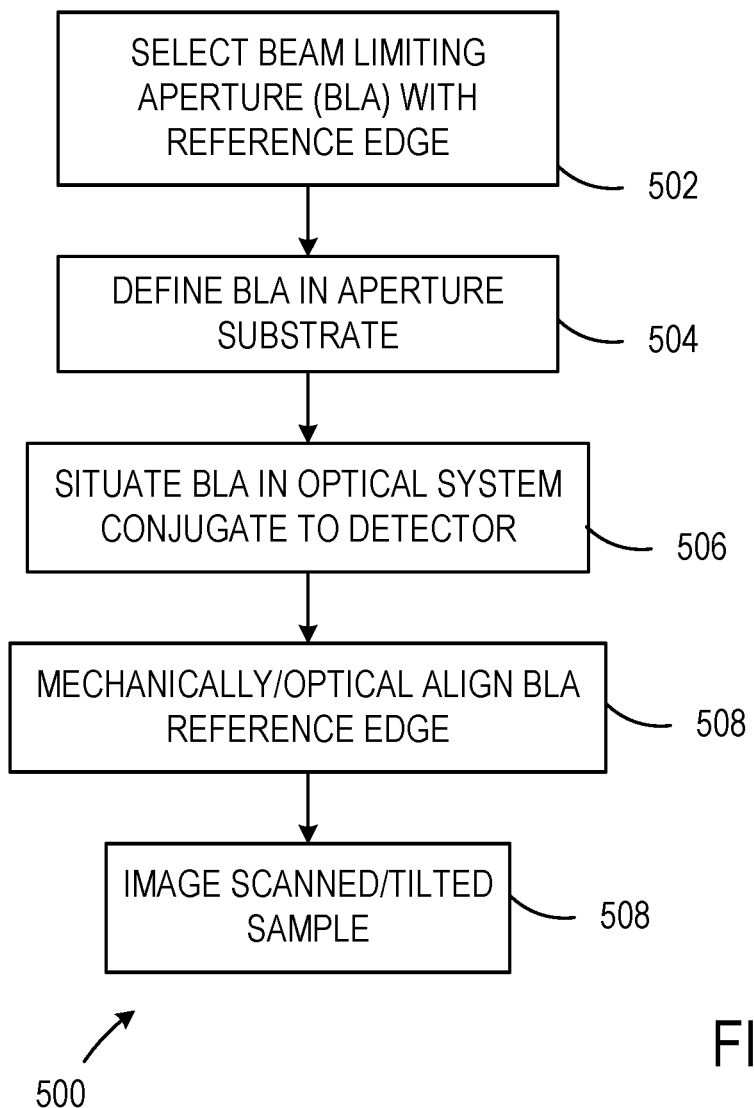
FIG. 5 illustrates a representative method.

Referring to FIG. 5, a representative method 500 includes selecting a beam liming aperture (BLA) having at least a reference edge at 502. The reference edge of the BLA is selected to reduce sample dose prior to imaging. At 504 the BLA is defined in an aperture substrate such as a metal or a conductively coated insulator. At 506, the BLA is situated to be conjugate to a detector in, for example, a charged particle beam imaging system. At 508, the reference edge of the BLA is mechanically aligned with the detector by translations of one or more of the BLA, a BLA stage, a sample substrate stage, or the detector or aligned using a charged particle beam optical system. At 510, the sample is scanned and imaged.

Example 6

Figure 6:
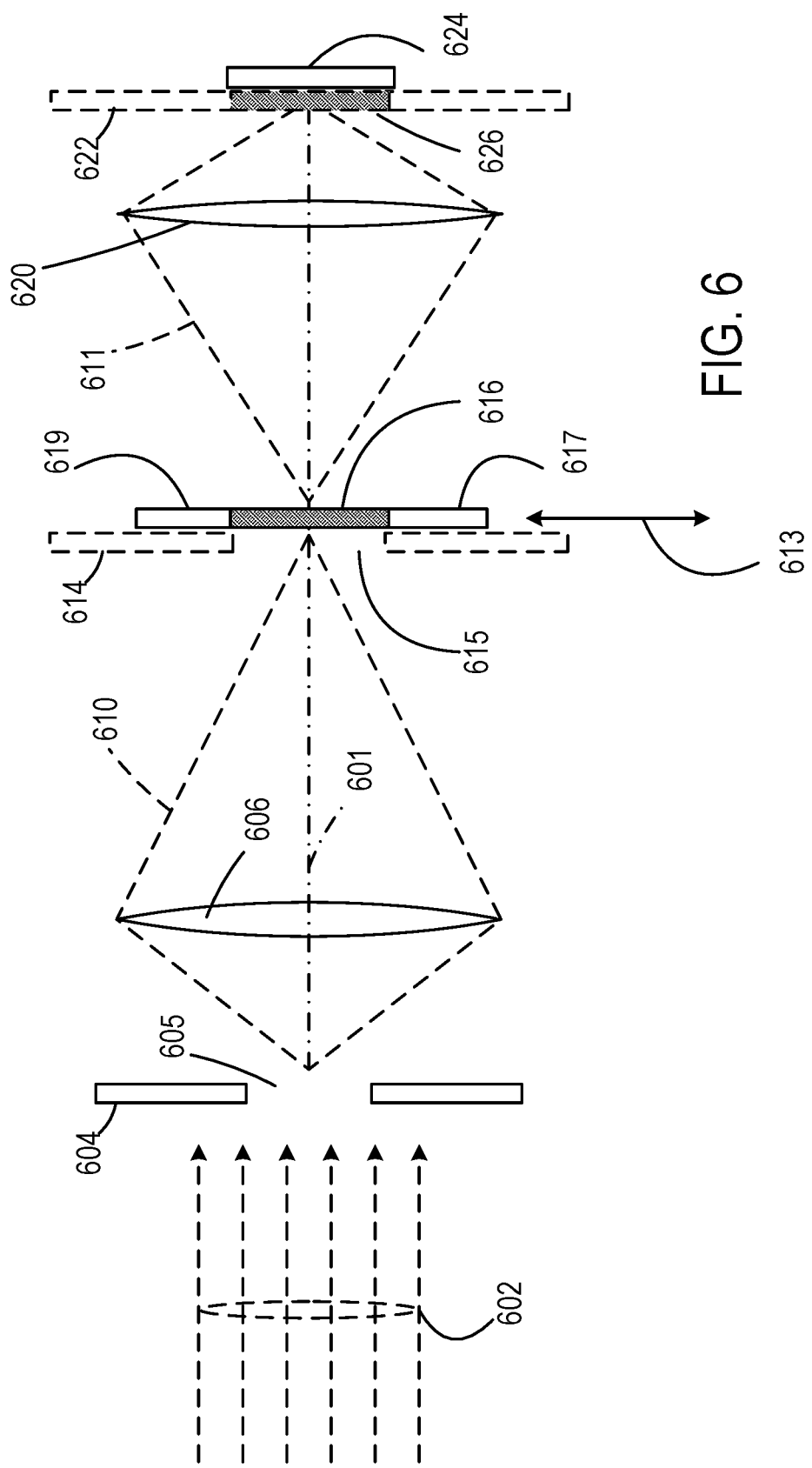
FIG. 6 illustrates a representative optical system in which a BLA is optically imaged to be conjugate to a detector.

The examples above illustrate dose control with a BLA without the use of optical elements to re-image the BLA at a sample location. Referring to FIG. 6, a representative optical system 600 (using charged particles or electromagnetic radiation), arranged along an axis 601, includes an aperture plate 604 that defines an aperture 605 that is situated to receive a beam 602 from a suitable source (not shown in FIG. 6). A lens 606 re-images the aperture 605 to form an exposure zone 615; a corresponding image 614 of the aperture plate 604 is shown for purposes of explanation. A sample portion 616 is exposed while sample portions 617, 619 are not. The exposed sample portion 616 (or a portion thereof) is imaged by a lens 620 onto a detector 624; images 622, 626 correspond to the aperture plate 604 and the exposed sample portion 616, respectively. As discussed above, the sample can be scanned and/or tilted as indicated at 613 to produce images suitable for tomographic reconstruction. Representative ray paths 610, 611 are shown for purposes of illustration. This optical arrangement can be configured with charged-particle-beam optical elements, light optics, or other optical arrangements.

In view of the many possible embodiments to which the principles of the disclosed technology may be applied, it should be recognized that the illustrated embodiments are only examples and should not be taken as limiting in scope. We therefore claim as all that comes within the scope and spirit of the appended claims.

We claim:

1. A method, comprising:
   defining an irradiation zone with a beam limiting aperture;
   situating a detector to receive radiation from a detector zone of the irradiation zone, wherein the detector zone is conjugate to a detector active area;
   positioning a first portion of a sample within the detector zone, wherein at least a second portion of the sample is positioned outside of the irradiation zone;
   producing a first image of the first portion of the sample based on radiation received by the detector when the first portion of the sample is positioned within the detector zone;
   translating the sample so that the second portion of the sample is positioned within the detector zone; and
   producing a second image of the second portion of the sample based on radiation received by the detector when the second portion of the sample is positioned within the detector zone.

2. The method of claim 1, further comprising translating the sample so that a third portion of the sample positioned outside of the irradiation zone is moved into the detector zone; and
   producing
   a third image of the third portion of the sample based on radiation received by the detector when the third portion of the sample is positioned within the detector zone.

3. The method of claim 1, further comprising:
   applying a plurality of translations of the sample to position each of a plurality of additional portions of the sample situated outside of the irradiation zone within the detector zone; and
   producing an image of each of the plurality of additional portions based on radiation received by the detector when each additional portion of the sample is positioned within the detector zone.

4. The method of claim 1, wherein the radiation is produced by a charged particle beam.

5. The method of claim 1, wherein the detector has at least one edge and the beam limiting aperture defines a conjugate edge in the detector zone and the first and second portions of the sample are translated into the detector zone at the conjugate edge.

6. The method of claim 5, wherein the beam limiting aperture includes an arc-shaped perimeter portion defining a portion of the irradiation zone that that extends beyond the detector zone.

7. The method of claim 6, wherein at least a portion of the sample is scanned from the detector zone into the portion of the irradiation zone that that extends beyond the detector zone.

8. The method of claim 7, wherein a shielded area of the irradiation zone is conjugate to a portion of the detector active area.

9. The method of claim 1, further comprising producing a plurality of images of at least the first and second portions of the sample at a plurality of rotation angles.

10. The method of claim 9, where the first and second portions of the sample are stepped into the detector zone or continuously scanned into the detection zone.

11. The method of claim 1, further comprising directing a charged particle beam to the beam limiting aperture to irradiate the irradiation zone, wherein the first and second images are produced based on the radiation from the charged particle beam.

12. A charged particle beam system, comprising:
a charged particle beam source operable to produce a charged particle beam;
an aperture plate defining a beam limiting aperture having a linear edge, wherein the aperture plate is situated to receive the charged particle beam and produce a sample irradiation zone corresponding to the beam limiting aperture;
a detector situated to receive radiation from a detector zone of the irradiation zone, the detector zone conjugate to a detector active area and having a detector zone edge conjugate to the linear edge of the beam limiting aperture, wherein the detector is situated to produce at least first and second images of respective first and second sample portions introduced into the detector zone at the detector zone edge; and
a stage controller coupled to position a first portion of a sample within the detector zone, wherein at least a second portion of the sample is positioned outside of the irradiation zone, and translate the sample so that the second portion of the sample is positioned within the detector zone so that the detector produces a first image of the first portion of the sample based on radiation received by the detector when the first portion of the sample is positioned within the detector zone and a second image of the second portion of the sample based on radiation received by the detector when the second portion of the sample is positioned within the detector zone.

13. The charged particle beam system of claim 12, wherein the charged particle beam is an electron beam and the detector is operable to produce the first and second images based on portions of the electron beam scattered, reflected, or transmitted by the sample.

14. The charged particle beam system of claim 12, wherein the beam limiting aperture has an arcuate edge that terminates at the linear edge.

15. The charged particle beam system of claim 12, wherein the sample irradiation zone includes an area extending beyond the detector zone.

16. The charged particle beam system of claim 12, wherein the detector is operable to produce the first and second images as a first part of the sample is introduced into detector zone and a second part of the sample exits the detector zone.

17. The charged particle beam system of claim 12, wherein the detector is situated so that the detector zone edge is situated to be conjugate to an edge of a detector active area.

18. The charged particle beam system of claim 12, wherein the linear edge is situated to define a shielded area so that the sample is introduced from the shielded area into the detector zone.

19. The charged particle beam system of claim 12, further comprising a sample stage coupled to the stage controller and operable to translate the sample into the detector zone and rotate the sample about at least one axis, wherein the detector is operable to produce images at a plurality or rotations.

* * * * *

UNITED STATES PATENT AND TRADEMARK OFFICE
CERTIFICATE OF CORRECTION

PATENT NO. : 11,430,633 B2
APPLICATION NO. : 17/137130
DATED : August 30, 2022
INVENTOR(S) : Shanel et al.

It is certified that error appears in the above-identified patent and that said Letters Patent is hereby corrected as shown below:

In the Claims

Column 8, Line 48, Claim 6, "zone that that extends" should read --zone that extends--

Column 8, Line 52, Claim 7, "zone that that extends" should read --zone that extends--

Signed and Sealed this
Thirteenth Day of August, 2024

Katherine Kelly Vidal
*Director of the United States Patent and Trademark Office*